(12) United States Patent
Sathianthan

(10) Patent No.: US 8,508,275 B2
(45) Date of Patent: Aug. 13, 2013

(54) SEMI-DYNAMIC FLIP-FLOP WITH PARTIALLY FLOATING EVALUATION WINDOW

(75) Inventor: Harikaran Sathianthan, Campbell, CA (US)

(73) Assignee: Oracle International Corporation, Redwood City, CA (US)

( * ) Notice: Subject to any disclaimer, the term of this patent is extended or adjusted under 35 U.S.C. 154(b) by 0 days.

(21) Appl. No.: 13/270,683

(22) Filed: Oct. 11, 2011

(65) Prior Publication Data

US 2013/0088273 A1    Apr. 11, 2013

(51) Int. Cl.
*H03K 3/289* (2006.01)

(52) U.S. Cl.
USPC .......................... 327/202; 327/203; 327/214

(58) Field of Classification Search
USPC ........................................ 327/199–203, 214
See application file for complete search history.

(56) References Cited

U.S. PATENT DOCUMENTS

| | | | |
|---|---|---|---|
| 5,825,224 A * | 10/1998 | Klass et al. | 327/200 |
| 5,898,330 A | 4/1999 | Klass | |
| 5,917,355 A | 6/1999 | Klass | |
| 6,972,605 B1 | 12/2005 | Choe | |
| 7,236,043 B2 * | 6/2007 | Wich et al. | 327/525 |
| 7,411,436 B2 * | 8/2008 | Fang et al. | 327/262 |
| 7,453,300 B2 * | 11/2008 | Won et al. | 327/218 |

* cited by examiner

*Primary Examiner* — Hai L Nguyen
(74) *Attorney, Agent, or Firm* — Polsinelli PC

(57) ABSTRACT

Implementations of the present disclosure involve a semi-dynamic flip-flop circuit incorporating a partially floating evaluation window that provides a faster data to output delay, a PMOS keeper device may be placed in series with an existing keeper circuit of the semi-dynamic flip-flop circuit. The gate of the PMOS series keeper device may be connected to a shut-off signal of the semi-dynamic flip-flop circuit that provides a three gate delay, self-timed positive pulse to control the keeper circuit. The PMOS series keeper device effectively turns off the keeper circuit when the clock signal rises but turns in back on after a three gate delay to sustain the precharge state of the dynamic node. The effective turning on and off of the keeper circuit portion may decrease the data to output delay of the flip-flop, resulting in higher performing microprocessors.

20 Claims, 2 Drawing Sheets

US 8,508,275 B2

SEMI-DYNAMIC FLIP-FLOP WITH PARTIALLY FLOATING EVALUATION WINDOW

FIELD OF THE INVENTION

Aspects of the present application relates generally to logic circuits and, more particularly, to semi-dynamic flip-flop circuits.

BACKGROUND

In modern electronics, a flip-flop is a circuit that has two stable states and can be utilized to store state information, typically referred to as a "0" state or a "1" state that form the basic language of all modern computing systems. The flip-flop circuits are combined within the design of the computing system to store and process these states during operation of the computing system. Several different types of flip-flops exist in the art and are used in computing systems; including static flip-flops (providing a fixed static logic signal at the output) and dynamic flip-flops (providing a monotonic output if the input data is a logic "1" and a fixed "0" output if the data is "0"). In general, flip-flop circuits are the fundamental building blocks of digital electronic systems used in almost every modern computing device.

In computing systems that incorporate a high-performance microprocessor, flip-flops are typically designed to provide short latency and the capability to incorporate logic functions with a minimum delay time penalty. One such design, known as the semi-dynamic flip-flop, comprises a dynamic front-end such that the flip-flop can operate on the clock signal of the system and a static back-end to hold the state of the flip-flop stable for use by the system during system operation. However, while known semi-dynamic flip-flops provide several advantages over previously designed flip-flops, there is always the need in high-performing computing systems for faster performing and more stable flip-flops. In addition, as computing devices become smaller and smaller, the space consumed within a microprocessor chip by any component of the microprocessor becomes important. In general, circuit design of a microprocessor balances the need for faster performance, area consumed and stability or reliability of the circuit.

It is with these and other issues in mind that various aspects of the present disclosure were developed.

SUMMARY

Implementations of the present disclosure involve a semi-dynamic flip-flop circuit incorporating a partially floating evaluation window that provides a faster data to output delay. A PMOS keeper control device may be placed in series with an existing keeper circuit of the semi-dynamic flip-flop circuit. The gate of the PMOS series keeper device may be connected to a shut-off signal of the semi-dynamic flip-flop circuit that provides a three gate delay, self-timed positive pulse to control the keeper circuit. The PMOS keeper control device and control signal effectively controls the high or logical "1" aspect of the keeper circuit by cutting off a PMOS transistor of the keeper circuit when the control signal is high and, after a three gate delay following the clock signal going high, energizing the PMOS transistor to sustain the precharge state of the dynamic node. The effective turning on and off of the PMOS transistor of the keeper circuit of the semi-dynamic flip-flop circuit removes the fight between the discharge of a dynamic node and the keeper circuit to increase the data to output delay of the flip-flop, resulting in higher performing microprocessors.

One implementation of the present disclosure may take the form of a semi-dynamic flip-flop circuit configured to operate in a first phase and a second phase. The first stage may has a first input lead, a second input lead and an output lead, said first input lead of said first stage coupled to receive a first signal and said second input lead of said first stage coupled to receive a second signal. The first stage may comprise a delay circuit having an input lead coupled to the second input lead of the first stage and an output lead, the delay circuit configured to delay the second signal, a logic gate having a first input coupled to the output lead of the delay circuit, a second input and an output and a first transistor stack circuit having a first input lead coupled to receive the second signal, a second input lead coupled to receive the first signal and a third input lead coupled to receive the output from the logic gate. In addition, the first stage may also include a keeper circuit having a first input lead coupled to the second input of the logic gate and an output coupled to the output of the first stage, the keeper circuit configured to latch an output signal from the first stage and a keeper circuit having a first input lead coupled to the second input of the logic gate and an output coupled to the output of the first stage, the keeper circuit configured to latch an output signal from the first stage.

In addition, the first stage of the semi-dynamic flip-flop circuit may include a control transistor having a control input coupled to the output of the logic gate and an output lead coupled to a second input of the keeper circuit, the control transistor configured to provide a conductive path between the second input of the keeper circuit and a voltage source when, during the second phase, the output signal of logic gate has a logic level equivalent to a predetermined logic level. Also, the second stage of the semi-dynamic flip-flop circuit may include a first input lead coupled to the output lead of the first stage, a second input lead coupled to the second input lead of the first stage, and an output lead. The second stage may further comprise a second transistor stack circuit having a first input lead coupled to receive the second signal, a second input lead and a third input lead coupled to receive the output from the first stage and an output lead and a latch circuit having an input lead coupled to the output lead of the second transistor stack and an output lead coupled to the output lead of the second stage.

Another implementation of the present disclosure may take the form of circuit configured to operate in a first phase and a second phase. The circuit may include a first stage having a first input lead, a second input lead and an output lead, the first input lead of the first stage coupled to receive a first signal and the second input lead of the first stage coupled to receive a second signal. The first stage may comprise a first transistor having a first lead coupled to the second input lead of the first stage, a second transistor having a first lead coupled to a second lead of the first transistor and having an second lead coupled to the first input lead of the first stage, a third transistor having a first lead coupled to a third lead of the second transistor and having a second lead coupled to the output lead of the first stage and a fourth transistor having a first lead coupled to the output lead of the first stage and a second lead coupled to a voltage source. A keeper circuit may also be included, the keeper circuit having a first input lead coupled to the output lead of the first stage, the keeper circuit configured to latch an output signal from the first stage.

The first stage of the circuit may also include a logic gate having a first input lead coupled to a delay circuit, a second input lead coupled to an output lead of the first stage, and an output lead coupled to a third lead of the third transistor and a control transistor having a control input coupled to the output of the logic gate and an output lead coupled to a second input of the keeper circuit, the control transistor configured to provide a conductive path between the second input of the keeper circuit and the voltage source when, during the second phase, the output signal of the logic gate has a logic level equivalent to a predetermined logic level, the control transistor further configured to when, during the second phase, the output signal of logic gate is not at a logic level equivalent to a predetermined logic level, the control transistor is configured to interrupt the conductive path to the keeper circuit.

Also, the circuit may be configured such that during the first phase, the first stage is operative to provide at the output lead of the first stage an output signal at a predetermined logic level independent of a logic level of the first signal, and during the second phase, the first stage is operative to provide at the output lead of the first stage an output signal as a function of the logic level of the first signal received at the first input lead of the first stage.

DETAILED DESCRIPTION

Implementations of the present disclosure involve a semi-dynamic flip-flop circuit incorporating a partially floating evaluation window that provides a faster data to output delay. More particularly and as described in more detail below, the data to output delay of the flip-flop circuit may be increased if the evaluation phase of the circuit does not actively fight the precharge keeper circuit. Instead, by actively energizing and de-energizing the keeper circuit portion of the semi-dynamic flip-flop with a gate delayed control signal, the fight between a first node of the circuit and the keeper circuit portion may be more properly managed. The use of the control signal to control the keeper circuit portion may increase the data to output delay of the flip-flop, resulting in higher performing microprocessors.

In one embodiment, a PMOS keeper device may be placed in series with an existing keeper circuit of the semi-dynamic flip-flop circuit. The gate of the PMOS series keeper device may be connected to a shut-off signal of the semi-dynamic flip-flop circuit that provides a three gate delay, self-timed positive pulse to control the keeper circuit. The PMOS keeper control device and control signal effectively controls the high or logical "1" aspect of the keeper circuit by cutting off a PMOS transistor of the keeper circuit when the control signal is high and, after a three gate delay following the clock signal going high, energizing the PMOS transistor to sustain the precharge state of the dynamic node. Thus, if the input is a logical "1", the dynamic node of the semi-dynamic flip-flop circuit can discharge without fighting the keeper circuit that attempts to maintain the dynamic node high. The basic structure and operation of one embodiment of a semi-dynamic flip-flop is provided below.

Figure 1:
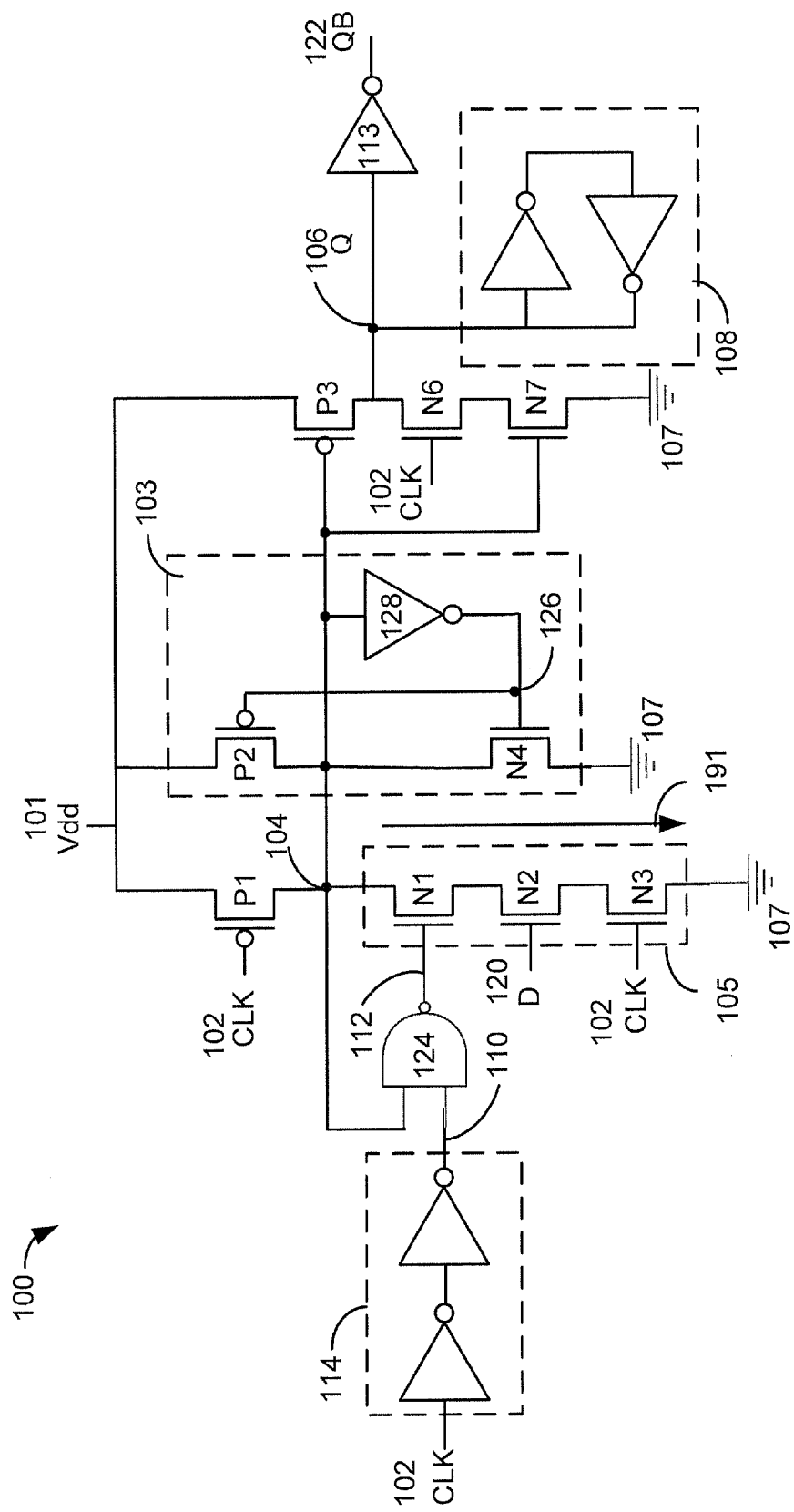
FIG. 1 is a schematic diagram of a prior art semi-dynamic flip-flop circuit.

As mentioned above, semi-dynamic flip-flop circuits are utilized in high-speed microprocessors. FIG. 1 is a schematic diagram of one embodiment of a typical prior art semi-dynamic flip-flop circuit 100. The circuit of FIG. 1 is provided herein as an example of a typical semi-dynamic flip flop and to illustrate the basic operation of semi-dynamic flip flop circuits. Further description of the semi-dynamic flip-flop circuit is described in U.S. Pat. No. 5,917,355, which is incorporated by reference in its entirety herein. After the basic semi-dynamic flip flop design is described, a semi-dynamic flip flop with a floating point evaluation window is provided in the description of FIG. 2.

Flip-flops either sample a logic "1" or "0" at the data inputs when the clock switches from low to high. One metric of flip-flop performance is the clock to flip-flop output delay. The semi-dynamic flop, such as that shown in FIG. 1, allows a very fast "0" data to propagate to the flop output because the value is always default stored in the dynamic node of the flip-flop (node 104), in terms of being precharged to the VDD voltage supply (the flip flop of FIG. 1 is an inverting logic structure so if D=0, then the output "QB"=1 and if D=1, then QB=0). In the second half of every clock cycle, the clock will be low so the dynamic node will be precharged high through PMOS P1.

As seen in FIG. 1, semi-dynamic flip-flop circuit 100 includes a first supply voltage 101, typically Vdd, a keeper circuit portion 103 and an NMOS evaluation stack 105 including NMOS transistors N1, N2 and N3, coupled to a second supply voltage 107, typically ground. The circuit samples input D 120 and produces output Q 106 and complement QB 122. In basic operation, the semi-dynamic flip-flop circuit 100 receives input D 120 dynamically and stores the output Q 106 and complement QB 122 statically for use in a computing system.

Semi-dynamic flip-flop circuit 100 typically has two modes, or phases, of operation; a pre-charge phase and an evaluation phase. In the pre-charge phase, the clock signal CLK 102 is low or a logical "0" such that a first node 104 is precharged high, or a logical "1" from the Vdd supply through the PMOS transistor P1. More particularly, a low CLK signal 102 effectively turns off NMOS transistor N3 and turns on PMOS P1 to maintain first node 104 at a precharged high. Further, in this phase, the high value at node 104 effectively cuts off node 106 from the input circuit (by the P3-N6-N7 stack). In this phase, the static latch circuit 108 holds the previous value of node 106 statically for output of the semi-dynamic circuit. Further, because the signal at node 110 is also low during the precharge phase, node 112 at the output of NAND gate 124 remains high, which holds shut-off transistor N1 on. The operation of the shut-off transistor N1 is described in more detail below.

The evaluation phase of the semi-dynamic flip-flop circuit 100 begins on the rising edge of clock signal CLK 102. When clock switches high at the beginning of the next cycle, NMOS N2 will sample the value of "D". If D=0, then N2 does not turn on to discharge the dynamic node through the series current path of N1, N2 and N3. Since PMOS P1 is off during the time when CLK is high, it is left to PMOS P2 to keep the pre-charged state through the positive regenerative feedback loop from the dynamic node through the feedforward inverter 128 to node 126, which drives the feedback inverter formed from the connections of PMOS P2 and NMOS N4. The precharged value at the input to inverter 128 results in a "0" at node 126 which keeps PMOS P2 on and to preserve the precharged value on node 104 while NMOS N4 remains off. When CLK switches high, transistor NMOS N6 also turns on and the precharged value at node 104 is inverted by the tristate inverter formed by the transistor tree P3, N6 & N7, with a resulting "0" stored in node 106 (Q) and finally inverted again to output QB (node 122). When CLK goes low in the second half of the cycle, PMOS P1 turns on to precharge node 104 while NMOS N6 is off, which disconnects the logic path from the precharged node 104 to the latch storage node 106 and to allow node 106 to hold its value for the rest of the cycle (since the flip-flop must, by definition, hold one logic value for the entire clock cycle).

If D=1 when CLK goes high, then transistor tree N1, N2 & N3 will try to discharge node 104 to VSS (node 107). However, to do so, it overcomes the PMOS keeper P2 which is trying to preserve the default precharged value. Moreover, the discharge of node 104 completes in less than the 3 gate delay time it would take for CLK to reach node 112 and shut off NMOS N1 and block the evaluation of the D=1 logic path. This is one reason why NMOS feedback N4 exists: to speed up the discharge path by turning on even as node 126 tries to turn off the PMOS P2 keeper device. Still, this can only happen if the NMOS evaluation tree is able to pull node 104 low enough to turn on inverter 128, despite the active effort by PMOS P2 to keep that node high. Once node 104 pulls low enough, there are two separate paths by which that low value is regeneratively preserved: first through the NMOS keeper N4 and second by gating off NAND gate 124 which prevents the 3 gate clock delay path from turning off NMOS N1 and shutting off the NMOS evaluation tree.

As described above, before the start of the evaluation phase, the dynamic node 104 is precharged to a logic "1" or high. Then, depending on the data input signal D at about the start of the evaluation phase, the circuit causes the node 104 to transition to a logic low level or else remain at the logic high level. In this circuit, when the data signal D is high at the initial portion of the evaluation phase, node 104 transitions low. Conversely, when the data signal D is low at the initial portion of the evaluation phase, the node 104 remains high. In addition, once node 104 transitions to a low level during the evaluation phase, the circuit prevents node 104 from having a high level during the same evaluation phase.

In addition, the shut-off signal (node 112) operates to maintain the logic level of the node 104 high if the logic level of the data signal D does not change to a logic high level within a relatively short time period (hold time) from the start of the evaluation phase (i.e., a short "window" after the rising edge of the clock signal CK). This short window gives the flip-flop circuit 100 an edge-triggered operation. Therefore, during the evaluation phase, the node 104 either remains stable at a logic high level throughout the rest of the evaluation phase, or else transitions from a logic high level to a logic low level shortly after the rising edge of the clock signal CK, remaining stable at the logic low level throughout the rest of the evaluation phase.

Also, the transition to the evaluation phase causes the output signal Q and QB to have a logic level dependent on the logic level of that at node 104. Because the logic level of the node 104 remains stable throughout the evaluation phase shortly after the rising edge of the clock signal CK, output signal Q is maintained with a static logic level throughout the rest of the clock cycle.

During a high-to-low transition of the flop, the rising edge of the clock signal CK results in a delayed clock signal to have a rising edge after two short inverter delays, at node 110. Because node 104 is precharged high, the now logic high level of the delayed clock signal at node 110 causes the NAND gate 124 to output the shut-off signal with a logic low level. The resulting logic low level of the shut-off signal causes the n-channel transistor N1 to turn off, acting as a shut-off operation for transistor N1. The shut-off operation prevents a subsequent low-to-high transition of data signal D from discharging node 104. Therefore, the delay of the inverters INV1 and INV2 pair 114 plus the delay of the NAND gate 124, determines the hold time of the flip-flop circuit 100 when the flip-flop circuit 100 latches a "zero".

Similarly, during a low-to-high transition, the rising edge of the clock signal CK causes the delayed clock signal to have a rising edge after two short inverter delays. Because node 104 is already at a logic low level due to the discharge through the transistor stack 105 described above, the now logic high level of the delayed clock signal does not cause NAND gate 124 to change the logic level of the shut-off signal. However, because the p-channel transistor P1 is off, once discharged, node 104 cannot again be charged during this evaluation phase even if the data signal D were to transition again to a logic low level. The latch formed by the keeper circuit 103 prevents the voltage of node 104 from floating, maintaining the signal at a logic low level. This operation provides part of the edge-triggered operation of the flip-flop circuit 100.

Further, the high-to-low transition of node 104 forces the shut-off signal to remain high, thus preventing the shut-off of transistor N1. The two inverters 114, in effect, prevent the early shut-off of the n-channel transistor N1, since the rising edge of the delayed clock signal arrives about one gate delay after the falling edge of the signal at node 104.

This semi-dynamic flip-flop circuit 100 functions reasonably well in either low speed environments or low noise environments, however, the semi-dynamic flip-flop circuit 100 does not perform well in high speed and/or high noise applications. This is because, with prior art semi-dynamic flip-flop circuit 100, the transition from the pre-charge phase to the evaluation phase involves an inherent problem regarding node 104, the keeper circuit 103 and NMOS stack 105.

This problem arises because, at the transition from the pre-charge phase to the evaluation phase, the signal CLK 102 goes high and transistor N1 is turned on. Consequently, NMOS stack 105 provides a path 191 from node 104 to second supply voltage 107, typically ground, through NMOS stack 105. Once path 191 was established, node 104 should drop to a digital "0" as rapidly as possible to avoid delays in operation of the semi-dynamic flip-flop circuit 100. However, in this same time frame, the keeper circuit 103 is attempting to hold node 104 at first supply voltage 101, i.e., at a digital "1". Consequently, in the semi-dynamic flip-flop circuit 100 there was an inherent "fight" between node 104, trying to discharge to "0" and the keeper circuit 103 trying to hold node 104 at "1" during the transition between pre-charge and evaluation. This fight may result in delays in the operation of semi-dynamic flip-flop circuit 100.

Figure 2:
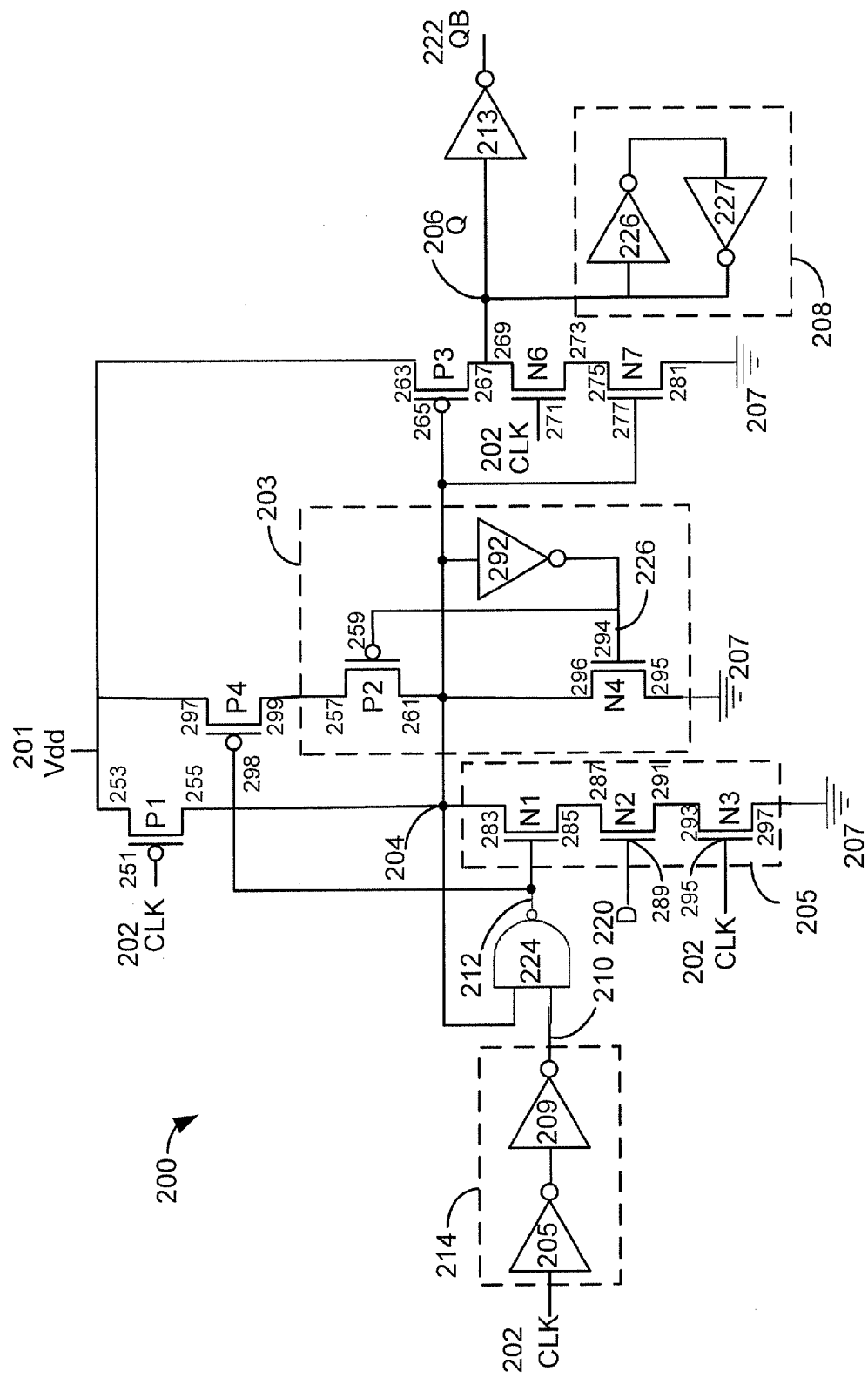
FIG. 2 is a schematic diagram of one embodiment of a semi-dynamic flip-flop circuit utilizing a partially floating evaluation window according to principles of the present disclosure.

To address this inherent fight between node 104 and the keeper circuit, a floating evaluation window may be incorporated into the semi-dynamic flip-flop circuit to reduce the influence of the keeper circuit on node 104. More particularly and as shown in FIG. 2, a PMOS control transistor (P4 in FIG. 2) is placed in series with the keeper circuit 203. The gate input for the PMOS P4 is connected to the output of the NAND 224 (node 212) of the shut-off portion of the circuit. In operation, the output of the NAND 224 provides a control signal to the PMOS control transistor P4 that turns off the PMOS control transistor, but energizes the PMOS control transistor after a three gate delay following a high clock signal. This energizes the keeper circuit 203 after the three gate delay to sustain the precharge state of node 214 if the input D 220 is low. If the input D 220 is high, node 214 discharges through the NMOS stack 207 without fighting the keeper circuit 203, since the keeper circuit is initially turned off by PMOS control transistor P4. Also, because node 214 is now at a logical low, the output of NAND 224 at node 212 remains high after the three gate delay such that PMOS control transistor P4 remains off until the next clock edge. By adding control transistor P4 to the series keeper path in FIG. 2, a performance advantage is added at very little device connectivity or area cost to the pre-existing design. Now, when CLK goes high, control transistor P4 is off for the same three gate delay window that allows NMOS N1 to be on so that, when D=1, the evaluation can happen without fighting the series PMOS keepers of P2 & P4. This allows faster and more reliable evaluation and hence, faster clock to data output delay.

A more particular discussion of the circuit of FIG. 2 is now provided. FIG. 2 shows a schematic diagram of one embodiment of a semi-dynamic flip-flop circuit 200 with a floating evaluation window. As seen in FIG. 2, semi-dynamic flip-flop circuit 200 includes a first supply voltage 201, in one embodiment Vdd, coupled to a first flow electrode 253, of a first PMOS transistor P1; a first flow electrode 297 of a fourth PMOS transistor P4; and a first flow electrode 263 of a third PMOS transistor P3. The signal CLK 202 is coupled to a control electrode 251 of transistor P1; a control electrode 295 of NMOS transistor N3; a control electrode 271 of a NMOS transistor N6; and an input to a delay circuit 214 consisting, in one embodiment of a first inverter 205 and a second inverter 209 connected in series.

A second flow electrode 255 of PMOS transistor P1 is coupled to a first node 204. Further, the first node 204 is coupled to a second flow electrode 261 of PMOS transistor P2. A first flow electrode 257 of PMOS transistor P2 is coupled to a second flow electrode 299 of PMOS transistor P4. Also, according to one embodiment of the circuit 200, an output 212 of a NAND gate 224 is coupled to a control electrode 298 of PMOS transistor P4. The operation of the NAND gate 224 to control PMOS transistor P4 is described in more detail below.

Additionally, an input of a sixth inverter 292 is coupled to the first node 204. An output of the sixth inverter 292 is coupled to a control electrode 294 of NMOS transistor N4. A first flow electrode 296 of NMOS transistor N4 is also coupled to first node 204 with a second flow electrode 295 of NMOS transistor N4 coupled to second supply voltage 207, shown as ground in FIG. 2. In general, the sixth inverter 292, NMOS transistor N4 and PMOS transistor P2 form a keeper circuit 203 similar to that described above with reference to FIG. 1.

An output of the delay circuit 214 is coupled to a first input 213 of NAND gate 224. A second input 215 of NAND gate 224 is coupled to first node 204. The output of the NAND gate 224, herein node 212, is coupled to a control electrode of NMOS transistor N1. As also described below, the NAND gage 224 and the NMOS transistor N1 form a shut-off circuit.

In addition, a first flow electrode 283 of NMOS transistor N1 is coupled to first node 204. A second flow electrode 285 of NMOS transistor N1 is coupled to a first flow electrode 287 of a NMOS transistor N2. A second flow electrode 291 of NMOS transistor N2 is coupled to a first flow electrode 293 of NMOS transistor N3. A second flow electrode 297 of NMOS transistor N3 is coupled to a second supply voltage 207, in one embodiment ground. A control electrode 289 of NMOS transistor N2 is coupled to a data input D 220.

Semi-dynamic flip-flop circuit includes output terminal Q 206 is coupled to a first flow electrode 269 of NMOS transistor N6. A second flow electrode 273 of NMOS transistor N6 is coupled to a first flow electrode 275 of NMOS transistor N7. A second flow electrode 281 of NMOS transistor N7 is coupled to second supply voltage 207. A control electrode 277 of NMOS transistor N7 and a control electrode of PMOS transistor P3 are coupled to node 204. In addition, output terminal Q 206 is coupled to a second flow electrode 267 of PMOS transistor P3.

Output terminal Q 206 is also coupled to an input 231 of third inverter 233. An output 235 of third inverter 233 is coupled to a semi-dynamic flip-flop circuit output QB 222.

The semi-dynamic flip-flop circuit 200 also includes a static latch circuit 208. More particularly, output terminal Q 206 is coupled to an input of a fourth inverter 225 and output of a fifth inverter 227. In addition, the output of the fourth inverter 225 is coupled to the input of the fifth inverter 227.

Those of skill in the art will recognize that specific embodiments of semi-dynamic flip-flop circuit 200 are shown in FIG. 2 with specific transistors for illustrative purposes only and that the NMOS and PMOS transistors shown in the FIG. 2 can be readily exchanged for PMOS and NMOS transistors by reversing the polarities of the supply voltages 201 and 206 or by other well known circuit modifications. In addition, PMOS and NMOS transistors may be exchanged for other types of transistors, such as PFETs or NFETs.

In addition, those of skill in the art will readily recognize that the choice of first inverter 205 and second inverter 209 to comprise delay circuit 206 was made arbitrarily and for illustrative purposes only. Any number of inverters, or any form of delay circuitry could be easily used to accomplish the same result.

In operation, the semi-dynamic flip-flop circuit 200 has two modes, or phases, of operation; a pre-charge phase and an evaluation phase. In one embodiment of semi-dynamic flip-flop circuit 200, in the initial pre-charge phase, the signal CLK 201 is low. Consequently, the output on NAND gate output 224 is high such that PMOS control transistor P4 is off and PMOS transistor P1 is in the on state, or conducting state. Thus, node 204 is a high or a logical "1". At the beginning of the evaluation phase, signal CLK 202 goes high and the semi-dynamic flip-flop circuit 200 node 204 either remains high or discharges depending on the data at data input D 220.

As described above, the flip-flop circuit 200 includes a shut-off signal at the output of the NAND gate 224 (node 212). This node provides a shut-off signal to NMOS transistor N1 to prevent an undesirable transition of the input signal D 220 from being propagated to the output node 222. Further, this shut-off signal may also be utilized to control aspects of the keeper circuit 203 to prevent or reduce the internal fight during the discharge of node 204. More particularly, if semi-dynamic flip-flop circuit first node 204 discharges in response to a high input D signal 220, the output 212 of NAND gate 224 remains high and NMOS transistor N1 remains on while PMOS control transistor P4 remains off. Consequently, there is no fight during the discharge process since PMOS control transistor P4 is off, which turns off the keeper circuit 203 of the flip-flop circuit 200. On the other hand, if the data at input D 220 is low, the first node 204 remains high. The output at NAND gate output 212 switches to low three gate delays after the signal CLK 201. According to this one embodiment, this delay is provided by first and second inverters 205 and 209 and ensures that NMOS transistor N1 turns off and PMOS control transistor P4 turns on to reinforce a high on first node 204. This active control of the keeper circuit 203 at the beginning of the evaluation phase removes the fight at node 204 between the keeper attempting to maintain the precharge state and the discharge of the node 204 through the NMOS stack 205.

Those of skill in the art will recognize that the process discussed above will repeat for each switching of the system clock. Those of skill in the art will further recognize that the choice of signal highs and signal lows was made arbitrarily for illustrative purposes only and that at other times, and in other embodiments of the invention, signal highs could be replaced with signal lows and vice-versa.

As discussed above, the present invention is directed to a method and apparatus for creating a semi-dynamic flip-flop circuit with a floating evaluation window that is capable of operation in both high speed and high noise environments.

Since, according to the disclosure, the keeper circuit 203 does not resist, compete or "fight" the discharge of the first node 204 when there is a path from the first node to the second supply voltage 207, the delay of the semi-dynamic flip-flop decreases. This, in turn, means that computing systems and/or microprocessors that incorporate the semi-dynamic flip-flop circuits with a floating evaluation window may operate at faster speeds, with little to no cost in the footprint area of the microprocessor. This also allows the dynamic node (node 204) to evaluate faster, improving the set-up time of the flop that allows data to arrive earlier and be latched.

In addition, those of skill in the art will readily recognize that the choice of first inverter 205 and second inverter 209 to comprise delay circuit 214 was made arbitrarily and for illustrative purposes only. Any number of inverters, or any form of delay circuitry could be easily used to accomplish the same result.

Further, those of skill in the art will readily recognize that the semi-dynamic flip-flop circuit 200 may be coupled to any other circuit of an electronic device. For example, the semi-dynamic flip-flop circuit 200 may be coupled to a evaluation tree and/or a scan out latch to add additional functionality to the flip-flop circuit and/or to integrate the circuit into a broader circuit design.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A semi-dynamic flip-flop circuit configured to operate in a first phase and a second phase, said circuit comprising:
    a first stage having a first input lead, a second input lead and an output lead, the first input lead of the first stage coupled to receive a first signal and the second input lead of the first stage coupled to receive a second signal, the first stage comprising:
        a delay circuit having an input lead coupled to the second input lead of the first stage and an output lead, the delay circuit configured to delay the second signal;
        a logic gate having a first input coupled to the output lead of the delay circuit, a second input and an output;
        a first transistor stack circuit having a first input lead coupled to receive the second signal, a second input lead coupled to receive the first signal and a third input lead coupled to receive the output from the logic gate;
        a keeper circuit having a first input lead coupled to the second input of the logic gate and an output coupled to the output of the first stage, the keeper circuit configured to latch an output signal from the first stage; and
        a control transistor having a control input coupled to the output of the logic gate and an output lead coupled to a second input of the keeper circuit, the control transistor configured to provide a conductive path between the second input of the keeper circuit and a voltage source when, during the second phase, the output signal of the logic gate has a logic level equivalent to a predetermined logic level; and
    a second stage having a first input lead coupled to the output lead of the first stage, a second input lead coupled to the second input lead of the first stage, and an output lead, the second stage comprising:
        a second transistor stack circuit having a first input lead coupled to receive the second signal, a second input lead and a third input lead coupled to receive the output from the first stage and an output lead; and
        a latch circuit having an input lead coupled to the output lead of the second transistor stack and an output lead coupled to the output lead of the second stage.

2. The circuit of claim 1, wherein the first transistor stack comprises:
    a first transistor having a first lead coupled to the output lead of the first stage, an input lead coupled to the output lead of the logic gate and a second lead;
    a second transistor having a first lead coupled to the second lead of the first transistor, an input lead coupled to the first input lead of the first stage to receive the first signal and a second lead; and
    a third transistor having a first lead coupled to the second lead of the second transistor and an input lead coupled to receive the second signal.

3. The circuit of claim 1, wherein the delay circuit comprises:
    a first inverter having an input lead coupled to the second input lead of the first stage to receive the second signal and an output lead; and
    a second inverter having an input lead coupled to the output lead of the first inverter and an output lead coupled to the first input of the logic gate.

4. The circuit of claim 1 wherein the first stage further comprises:
    a sixth transistor having a first lead coupled to the output lead of the first stage, an input lead coupled to the second input lead of the first stage to receive the second signal and a second lead coupled to the voltage source.

5. The circuit of claim 1 wherein the keeper circuit comprises:
    a third inverter having an input lead coupled to the output lead of the first stage and an output lead;
    a fourth transistor having an input lead coupled to the output lead of the third inverter and a first input lead coupled to the output lead of the first stage; and
    a fifth transistor having an input lead coupled to the output lead of the third inverter, a first input lead coupled to the output lead of the control transistor and a second input lead coupled to the output lead of the first stage.

6. The circuit of claim 1, wherein the second transistor stack comprises:
    a seventh transistor having an input lead coupled to the output lead of the first stage and a second lead coupled to the output lead of the second stage;
    a eighth transistor having a first lead coupled to the second input lead of the second stage, an input lead coupled to the second input lead of the first stage to receive the second signal and a second lead; and a ninth transistor having an input lead coupled to the output lead of the first stage and a first lead coupled to the second lead of the eighth transistor.

7. The circuit of claim 1, wherein said latch circuit comprises:
   a third inverter having an input lead coupled to the output lead of the second stage and an output lead; and
   a fourth inverter having an input lead coupled to the output lead of the third inverter and an output lead coupled to the input lead of the third inverter.

8. The circuit of claim 1, wherein the second signal is a clock signal and the first signal is a data input signal.

9. The circuit of claim 1, wherein:
   during the first phase, the first stage is operative to provide at the output lead of the first stage an output signal at a predetermined logic level independent of a logic level of the first signal, and
   during the second phase, the first stage is operative to provide at the output lead of the first stage an output signal as a function of the logic level of the first signal received at the first input lead of the first stage.

10. The circuit of claim 9 wherein:
    during the first phase, the second stage is operative to maintain at the output lead of the second stage an output signal generated by the second stage during another second phase that was prior to the first phase, the second stage maintaining the output signal of the second stage independent of the output signal provided by the first stage during the first phase, and
    during the second phase, the second stage is operative to provide at the output lead of the second stage an output signal as a function of a logic level of the output signal of the first stage.

11. The circuit of claim 1, wherein during the second phase, the first transistor stack is configured to maintain a conductive path between the output lead of the first stage and a voltage source in response to the first signal being at a preselected logic level when the second phase begins, and is configured to interrupt the conductive path when the first signal is not at the preselected logic level when the second phase begins.

12. The circuit of claim 1 wherein when, during the second phase, the output signal of logic gate is not at a logic level equivalent to a predetermined logic level, the control transistor is configured to interrupt the conductive path to the keeper circuit.

13. The circuit of claim 1 wherein the output signal of the logic gate is a gate delayed signal of the second signal of the second input lead of the first stage.

14. A circuit configured to operate in a first phase and a second phase, said circuit comprising:
    a first stage having a first input lead, a second input lead and an output lead, the first input lead of the first stage coupled to receive a first signal and the second input lead of the first stage coupled to receive a second signal, wherein the first stage further comprises:
        a first transistor having a first lead coupled to the second input lead of the first stage;
        a second transistor having a first lead coupled to a second lead of the first transistor and having an second lead, coupled to the first input lead of the first stage;
        a third transistor having a first lead coupled to a third lead of the second transistor and having a second lead coupled to the output lead of the first stage;
        a fourth transistor having a first lead coupled to the output lead of the first stage and a second lead coupled to a voltage source;
    a keeper circuit having a first input lead coupled to the output lead of the first stage, the keeper circuit configured to latch an output signal from the first stage;
    a logic gate having a first input lead coupled to a delay circuit, a second input lead coupled to an output lead of the first stage, and an output lead coupled to a third lead of the third transistor; and
    a control transistor having a control input coupled to the output of the logic gate and an output lead coupled to a second input of the keeper circuit, the control transistor configured to provide a conductive path between the second input of the keeper circuit and the voltage source when, during the second phase, the output signal of the logic gate has a logic level equivalent to a predetermined logic level, the control transistor further configured to when, during the second phase, the output signal of logic gate is not at a logic level equivalent to a predetermined logic level, the control transistor is configured to interrupt the conductive path to the keeper circuit;
    wherein during the first phase, the first stage is operative to provide at the output lead of the first stage an output signal at a predetermined logic level independent of a logic level of the first signal, and
    during the second phase, the first stage is operative to provide at the output lead of the first stage an output signal as a function of the logic level of the first signal received at the first input lead of the first stage.

15. The circuit of claim 14 further comprising:
    a second stage having a first input lead coupled to the output lead of the first stage, a second input lead coupled to the second input lead of the first stage, and an output lead, the second stage comprising:
        a first transistor stack circuit having a first input lead coupled to receive the second signal, a second input lead and a third input lead coupled to receive the output from the first stage and an output lead; and
        a latch circuit having an input lead coupled to the output lead of the second transistor stack and an output lead coupled to the output lead of the second stage,
    wherein during the first phase, the second stage is operative to maintain at the output lead of the second stage an output signal generated by the second stage during another second phase that was prior to the first phase, the second stage maintaining the output signal of the second stage independent of the output signal provided by the first stage during the first phase, and
    during the second phase, the second stage is operative to provide at the output lead of the second stage an output signal as a function of a logic level of the output signal of the first stage.

16. The circuit of claim 15, wherein said latch circuit comprises:
    a third inverter having an input lead coupled to the output lead of the second stage and an output lead; and
    a fourth inverter having an input lead coupled to the output lead of the third inverter and an output lead coupled to the input lead of the third inverter.

17. The circuit of claim 14, wherein the keeper circuit comprises:
    a third inverter having an input lead coupled to the output lead of the first stage and an output lead;
    a fourth transistor having an input lead coupled to the output lead of the third inverter and a first input lead coupled to the output lead of the first stage; and
    a fifth transistor having an input lead coupled to the output lead of the third inverter, a first input lead coupled to the output lead of the control transistor and a second input lead coupled to the output lead of the first stage.

18. The circuit of claim 14, wherein the delay circuit comprises:
   a first inverter having an input lead coupled to the second input lead of the first stage to receive the second signal and an output lead; and
   a second inverter having an input lead coupled to the output lead of the first inverter and an output lead coupled to the first input of the logic gate.

19. The circuit of claim 14 wherein the output signal of the logic gate is a gate delayed signal of the second signal of the second input lead of the first stage.

20. The circuit of claim 19 wherein the second signal is a clock signal and the first signal is a data input signal.

* * * * *

UNITED STATES PATENT AND TRADEMARK OFFICE
CERTIFICATE OF CORRECTION

| | | |
|---|---|---|
| PATENT NO. | : 8,508,275 B2 | Page 1 of 1 |
| APPLICATION NO. | : 13/270683 | |
| DATED | : August 13, 2013 | |
| INVENTOR(S) | : Sathianthan | |

It is certified that error appears in the above-identified patent and that said Letters Patent is hereby corrected as shown below:

In the Claims:

In column 11, line 60, in Claim 14, delete "lead," and insert -- lead --, therefor.

Signed and Sealed this
Twelfth Day of November, 2013

Teresa Stanek Rea
*Deputy Director of the United States Patent and Trademark Office*

UNITED STATES PATENT AND TRADEMARK OFFICE
CERTIFICATE OF CORRECTION

PATENT NO. : 8,508,275 B2  
APPLICATION NO. : 13/270683  
DATED : August 13, 2013  
INVENTOR(S) : Harikaran Sathianathan Page 1 of 1

It is certified that error appears in the above-identified patent and that said Letters Patent is hereby corrected as shown below:

On the title page item (75) Inventor: Harikaran Sathianthan should be Harikaran Sathianathan Signed and Sealed this  
Twenty-ninth Day of December, 2015

Michelle K. Lee  
*Director of the United States Patent and Trademark Office*